United States Patent [19]

De Bar et al.

[11] 4,412,376

[45] Nov. 1, 1983

[54] FABRICATION METHOD FOR VERTICAL PNP STRUCTURE WITH SCHOTTKY BARRIER DIODE EMITTER UTILIZING ION IMPLANTATION

[75] Inventors: David E. De Bar, Manassas, Va.; Raymond W. Hamaker, Gilroy, Calif.; Geoffrey B. Stephens, Cary, N.C.

[73] Assignee: IBM Corporation, Armonk, N.Y.

[21] Appl. No.: 355,059

[22] Filed: Mar. 5, 1982

Related U.S. Application Data

[60] Continuation of Ser. No. 142,323, Apr. 21, 1980, abandoned, which is a division of Ser. No. 25,693, Mar. 20, 1979, abandoned.

[51] Int. Cl.$^3$ .................. H01L 21/265; H01L 21/283
[52] U.S. Cl. .............................. 29/576 B; 29/576 W; 29/578; 29/589; 29/590; 148/1.5; 148/187; 357/15; 357/34; 357/44; 357/91; 427/84
[58] Field of Search ............. 29/578, 589, 590, 576 B, 29/576 W, 577 C; 148/1.5, 187; 427/84; 357/15, 34, 44, 91

[56] References Cited

U.S. PATENT DOCUMENTS

| | | | |
|---|---|---|---|
| 2,634,322 | 4/1953 | Law | 357/15 X |
| 3,280,391 | 10/1966 | Bittmann et al. | 357/15 X |
| 3,623,925 | 11/1971 | Jenkins et al. | 148/1.5 X |
| 3,669,730 | 6/1972 | Lepselter | 357/15 X |
| 3,770,606 | 11/1973 | Lepselter | 357/15 X |
| 3,808,473 | 4/1974 | Yamashita et al. | 357/15 X |
| 3,841,904 | 10/1974 | Chiang | 357/15 X |
| 3,849,789 | 11/1974 | Cordes et al. | 357/15 |
| 3,871,067 | 3/1975 | Bogardus et al. | 29/590 X |
| 3,906,540 | 9/1975 | Hollins | 357/15 |
| 3,995,301 | 11/1976 | Magdo | 357/15 |
| 4,032,962 | 6/1977 | Balyoz et al. | 357/15 X |
| 4,045,248 | 8/1977 | Shannon et al. | 148/1.5 |
| 4,047,218 | 9/1977 | Clark et al. | 357/15 X |
| 4,076,556 | 2/1978 | Agraz-Guerena et al. | 357/15 X |
| 4,101,349 | 7/1978 | Roesner et al. | 357/15 X |
| 4,107,719 | 8/1978 | Graul et al. | 357/15 X |
| 4,111,720 | 9/1978 | Michel et al. | 148/1.5 |
| 4,127,860 | 11/1978 | Beelitz et al. | 357/15 X |
| 4,159,915 | 7/1979 | Anantha et al. | 148/1.5 |
| 4,160,988 | 7/1979 | Russell | 357/15 X |
| 4,183,036 | 1/1980 | Müller | 357/15 X |
| 4,214,256 | 7/1980 | Dalal | 357/71 |
| 4,215,156 | 7/1980 | Dalal | 427/84 |

FOREIGN PATENT DOCUMENTS

| | | |
|---|---|---|
| 2111761 | 9/1972 | France . |
| 52-91387 | 8/1977 | Japan . |
| 1311839 | 3/1973 | United Kingdom . |

OTHER PUBLICATIONS

Sullivan et al., "Hole-Trapping . . . Silicon-Doped Aluminum Schottky-Barrier . . . ", J. Appl. Physics, vol. 49, No. 6, Jun. 1978, pp. 3574-3577.

Reith, T. M., "Aging Effects in Silicon-Doped Aluminum Schottky Barrier Diodes", Appl. Physics Letters, vol. 28, No. 3, Feb. 1976, pp. 152-154.

Wurst et al., "Rectification Properties of Metal-Silicon Contacts", J. Appl. Physics, vol. 28, No. 2, Feb. 1957, pp. 235-240.

Gunn, J. B., "Theory of Rectification . . . at Metal-Semiconductor Contact", Proc. Physical Society, 1954, vol. 67, pp. 575-581.

Iizuka, T., "Semiconductor Device", Patent Abstracts of Japan, vol. 1, No. 150, Dec. 5, 1977.

Yu et al., "Minority Carrier Injection of Metal-Silicon Contacts", Solid-State Electronics, vol. 12, No. 3, 1969, pp. 155-160.

Reith et al., "Al-like Schottky Barrier Diode Formation Using Ti-W", IBM Tech. Discl. Bull., vol. 21, No. 1, Jun. 1978, pp. 142-143.

Reith et al., "Electrical Effect . . . Schottky Barrier . . . Al-Si Metal Films", Appl. Physics Letters, vol. 25, No. 9, Nov. 1, 1974, pp. 524-526.

Gniewek et al., "Three Barrier Height SBD Process", IBM Tech. Discl. Bull., vol. 20, No. 3, Aug. 1977, pp. 1001-1002.

Scharfetter, D. I., "Minority Carrier . . . Schottky Barrier Diodes", Solid State Electronics, vol. 8, 1965, pp. 299-311.

Blackstone et al., "Schottky Collector I$^2$L", IEEE J. Solid-State Circuits, vol. SC-12, No. 3, Jun. 1977, pp. 270-275.

Gittleman et al., "Metal Emitter PNP Cell", IBM Tech. Discl. Bull., vol. 20, No. 12, 1978, pp. 5190–5191.

*Primary Examiner*—W. G. Saba
*Attorney, Agent, or Firm*—John E. Hoel

[57] ABSTRACT

A vertical PNP bipolar transistor structure with Schottky Barrier diode emitter is disclosed which simplifies the structure and process steps for combining a complementary PNP in an NPN integrated circuit and improves the speed and density of the vertical PNP. The PNP emitter is formed with a Schottky contact such that only the PNP base region is contained in the NPN emitter junction structure. The structure uses a separately masked ion/implant for the NPN intrinsic base implant which also forms the PNP collector region so that the PNP base doping profile can intercept the PNP collector profile at a lower concentration resulting in lower collector/base capacitance, lower series collector resistance and higher collector/base breakdown voltage for the PNP. Since the base doping concentration is lower in the structure and the emitter has no sidewall capacitance, the PNP emitter-base capacitance is greatly reduced. These features result in an improved frequency response for the PNP structure.

3 Claims, 15 Drawing Figures

4,412,376

FABRICATION METHOD FOR VERTICAL PNP STRUCTURE WITH SCHOTTKY BARRIER DIODE EMITTER UTILIZING ION IMPLANTATION

This is a continuation of application Ser. No. 142,323 filed Apr. 21, 1980, now abandoned, which was a division of application Ser. No. 25,693 filed Mar. 20, 1979, now abandoned.

FIELD OF THE INVENTION

The invention disclosed broadly relates to semiconductor devices and more particularly relates to improvements in bipolar transistors.

BACKGROUND OF THE INVENTION

Complementary bipolar transistor circuits have been found to yield excellent switching characteristics because a PNP bipolar transistor can be used as an active load device for an active NPN bipolar transistor in a complementary bipolar inverter circuit. The problem with complementary bipolar circuits in the prior art is that their formation on a single integrated circuit chip requires more complex processing steps than would be required for an integrated circuit employing either all PNP type or all NPN type transistors. Device structures have been devised in the prior art employing a vertical NPN bipolar transistor and a lateral PNP bipolar transistor in the same integrated circuit chip. Process steps required to make such a structure are less complex than those for prior art vertical PNP and NPN transistors on the same semiconductor chip; however the switching characteristics of the resulting lateral PNP transistor are not nearly as excellent as are those of the NPN transistor produced by said processes. In addition, a lateral PNP transistor occupies a greater chip area than does a simple vertical PNP bipolar transistor.

It has been suggested in the prior art that a vertical PNP structure be formed within the P-type base region of what would have otherwise been a vertical NPN transistor in an integrated circuit, such as is shown in FIG. 1A. As shown in FIG. 1A, a conventional NPN bipolar transistor is formed by producing in the epitaxial layer 4 on the substrate 2, a P-type base region 6 into which an N-type emitter region 8 is introduced, with an N-type collector contact 10 connected to the N-type epitaxial region 4. P-type isolation regions 12 and an N-type subcollector region 14 may also be included in the structure. On the same integrated circuit substrate 2, another P-type region 6' which would have been the base region of an NPN vertical bipolar transistor, is used, instead, as the collector region 4 of PNP vertical bipolar transistor. In this structure, as shown in FIG. 1A, an N-type base region 16 is formed in the P-type collector region 6' followed by the introduction of a shallow P-type emitter region 18 in the base region 16. A base contact 20 of N-type conductivity may also be introduced into the base region 16. The resulting PNP structure 22 is compatible with the NPN vertical bipolar transistor process employed in making the NPN transistor 24, however severe switching problems occur with the PNP device 22 due to the relatively high collector resistance and a relatively low breakdown voltage between the collector 6' and base 16 due to the necessity of compensating for four different overlaid, doped regions. The excessive concentration of dopant atoms in the base region 16 and emitter region 18 distort the semiconductor lattice so as to reduce the mobility of minority charge carriers injected from the emitter into the base region and to increase the recombination rate of the minority carriers due to the formation of trapping centers in the base region.

OBJECTS OF THE INVENTION

It is therefore an object of the invention to provide an improved vertical PNP bipolar transistor.

It is still another object of the invention to provide an improved vertical PNP bipolar transistor in a simple NPN bipolar transistor process.

It is yet another object of the invention to provide a vertical PNP bipolar transistor with a lower base doping concentration to enable a longer minority carrier lifetime, a higher collector/base breakdown voltage, a lower series resistance in the collector because of a reduced compensation effect, and a lower collector/base capacitance, and a higher hole mobility because of the lower lattice distortion in the base region.

It is still a further object of the invention to provide a vertical PNP bipolar transistor with a narrow base width yielding an improved switching speed.

It is yet a further object of the invention to provide a vertical PNP bipolar transistor with a shallow emitter which yields a lower emitter/base capacitance.

SUMMARY OF THE INVENTION

These and other objects, features and advantages of the invention are accomplished by the vertical PNP structure with Schottky Barrier Diode emitter, disclosed herein. A vertical PNP structure with Schottky Barrier Diode emitter is disclosed which simplifies the structure and process steps for combining a complementary PNP in an NPN integrated circuit and improves the speed and density of the vertical PNP. The PNP emitter is formed with a Schottky contact such that only the PNP base region must be contained in the NPN emitter junction depth (see FIG. 2F). The structure uses a separately masked ion implantation for the NPN intrinsic base implant (which also forms the PNP collector region) so that the PNP base doping profile can intercept the PNP collector profile at a lower concentration resulting in lower collector/base capacitance, lower series collector resistance and higher collector/base breakdown voltage for the PNP. Since the base doping concentration is lower in the structure and the emitter has no sidewall capacitance, the PNP emitter-base capacitance is greatly reduced. These features result in an improved frequency response for the PNP structure.

DESCRIPTION OF THE FIGURES

These and other objects, features and advantages of the invention can be more fully appreciated with reference to the accompanying figures.

DISCUSSION OF THE PREFERRED EMBODIMENT

A vertical PNP structure with Schottky Barrier Diode emitter is disclosed which simplifies the structure and process steps for combining a complementary PNP in an NPN integrated circuit and improves the speed and density of the vertical PNP. The PNP emitter is formed with a Schottky contact such that only the PNP base region must be contained in the NPN emitter junction depth (see FIG. 2F). The structure uses a separately masked ion implantation for the NPN intrinsic base implant (which also forms the PNP collector region) so that the PNP base doping profile can intercept the PNP collector profile at a lower concentration resulting in lower collector/base capacitance, lower series collector resistance and higher collector/base breakdown voltage for the PNP. Since the base doping concentration is lower in the structure and the emitter has no sidewall components, the PNP emitter-base capacitance is greatly reduced. These features result in an improved frequency response for the PNP structure.

It is widely known that a Schottky Barrier Diode (SBD), although primarily a majority carrier device, has the ability to inject minority carriers when operated at sufficiently high current densities D. L. Scharfetter, Solid-State Electronics, 8,299 1965). Although this attribute is normally undesirable when using the SBD as a clamp in switching circuits (to diminish minority carrier storage in the vicinity of a collector/base junction), it can be used beneficially in the disclosed structure.

Figure 2G:
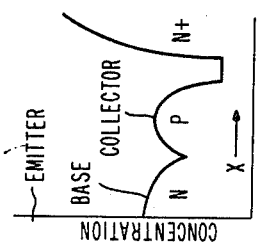
FIG. 2G is a cross-sectional view along the section line 2F—2F' of FIG. 2F, showing the doping profile.
Figure 2F:
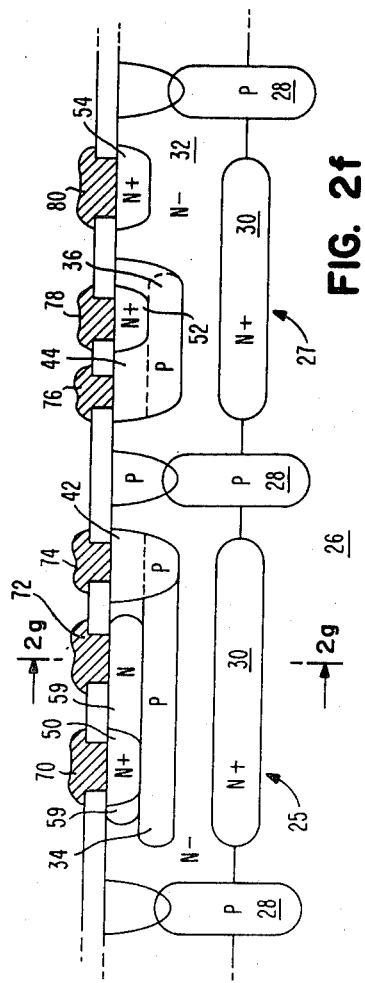
FIGS. 2A through 2F show the sequence of process steps necessary to achieve the vertical PNP structure with Schottky Barrier Diode emitter.

This invention forms the PNP emitter with a Schottky contact such that only the PNP base region must be contained in the NPN emitter junction depth (see FIG. 2F). Further, the structure disclosed uses a separately masked ion implant for the NPN intrinsic base implant (which also forms the PNP collector region) so that the PNP base doping profile can intercept the PNP collector profile at a lower concentration resulting in lower collector/base capacitance, lower series collector resistance and higher collector/base breakdown voltage for the PNP.

Since the base doping concentration is lower in this structure and the emitter has no sidewall component, the PNP emitter-base capacitance is greatly reduced. These features result in an improved frequency response for the PNP structure.

Figure 1B:
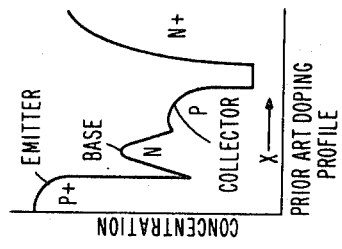
FIG. 1A is a cross-sectional view of a prior art vertical PNP bipolar transistor and FIG. 1B is a cross-sectional view along the section lines 1B—1B' of the PNP structure of FIG. 1A.
Figure 1A:
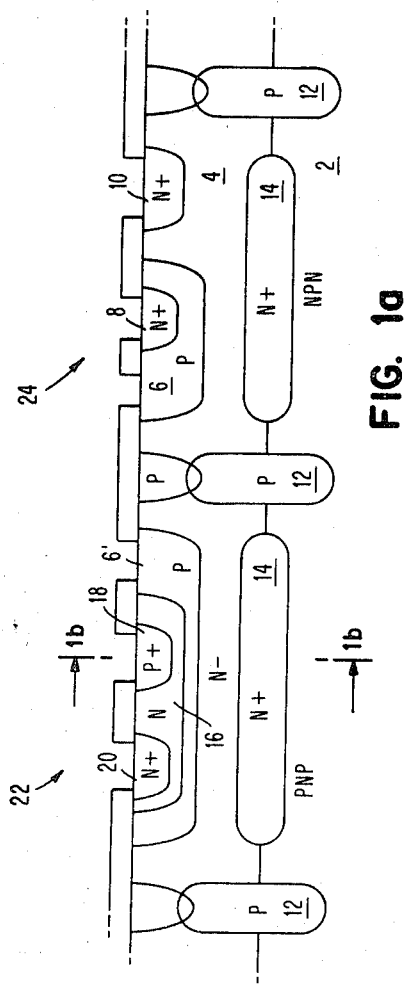

FIG. 1A illustrates a prior art vertical PNP structure and FIG. 1B shows the prior art doping profile on the section line 1B—1B' of FIG. 1A. An N-epitaxial layer 4 is grown on top of a silicon substrate 2 in which has been deposited the buried P-type isolation regions 12 and the buried N+ type subcollector regions 14. P-type base diffusions 6 and 6' are deposited in the surface of the epitaxial layer 4. The vertical NPN device 24 is then completed by depositing the emitter 8 and the collector contact 10 as shown in FIG. 1A. During the same step, the vertical PNP device 22 has its base contact 20 deposited, followed by the deposition of the N-type base region 16 which may be a faster diffusing N-type dopant such as phosphorous in comparison with a slower diffusing dopant such as arsenic for the base contact 20. This stage is followed by the deposition of the diffused P+ emitter 18 into the N-type base region 16 to complete the prior vertical PNP device 22. It is to be noted that the addition of a vertical PNP device in a conventional NPN process requires several additional steps which renders the overall process unduly complex.

Figure 2A:
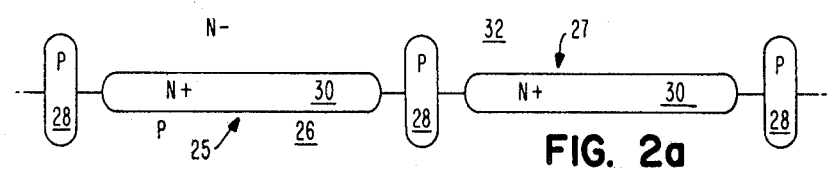
Figure 2B:
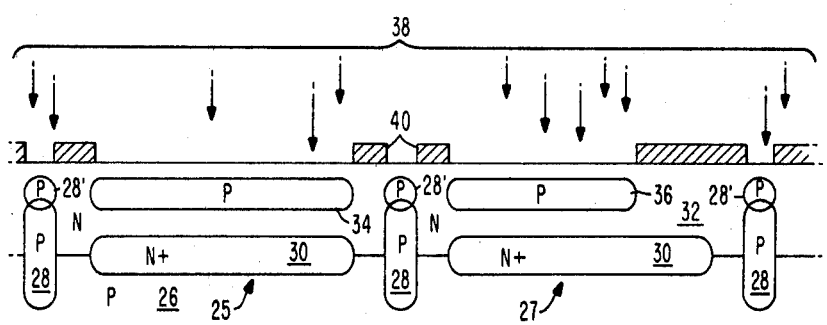

Referring now to the sequence of process steps 2A through 2F, the vertical PNP structure with Schottky Barrier Diode emitter will be fabricated. The process starts as it is depicted in FIG. 2A with the deposition of the N-silicon epitaxial layer 32 on top of the silicon substrate 26 along with the growth of the P-type isolation regions 28 and the N+ subcollectors 30. FIG. 2B illustrates the next step of depositing an ion-implantation mask 40 which may be a hardened photoresist, for example, and the ion implantation of boron ions 38, for example, forming the buried P-type regions 34 and 36 and the isolation extensions 28', all of which are of P-type conductivity. The ion-implant region 34 will ultimately form a portion of the P-type collector for the vertical PNP transistor 25 and the ion implanted P-type region 36 will ultimately form a portion of the P-type base for the NPN device 27.

Figure 2C:
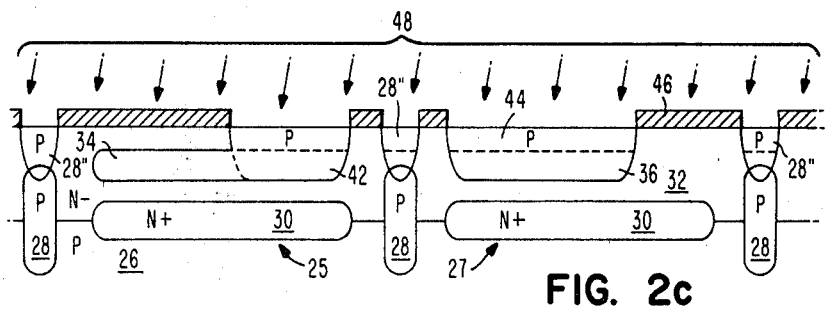

FIG. 2C illustrates the next step of forming a second ion-implantation mask 46 which may be a hardened photoresist, for example, which serves as a mask for a second boron ion implantation 48 to form the upper portion of the isolation regions 28", the upper portion of the P-type collector 42 for the PNP device 25 and the upper portion 44 of the P-type base for the NPN transistor 27.

Figure 2D:
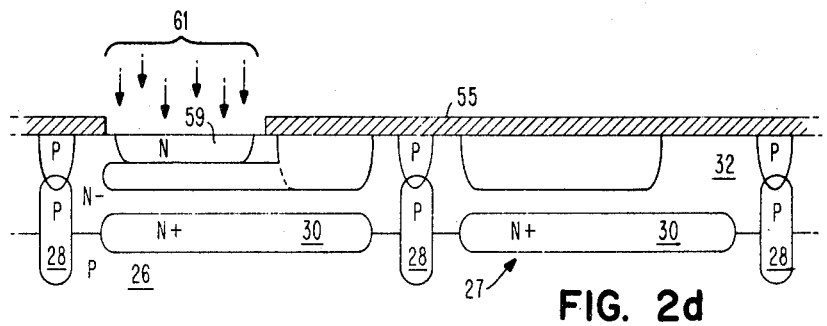

FIG. 2D illustrates the next step of forming a third ion-implantation mask 55 of a hardened photoresist, for example, ion-implanting an N-type dopant such as phosphorous ions 61 at an acceleration voltage of approximately 200 KeV and a dose of approximately $2 \times 10^{12}$ atoms per square centimeter, through the opening 57 to form the N-type base region 59 for the vertical PNP device 25. The base region has an N-type dopant concentration of less than $10^{17}$ atoms per cubic centimeter.

Figure 2E:
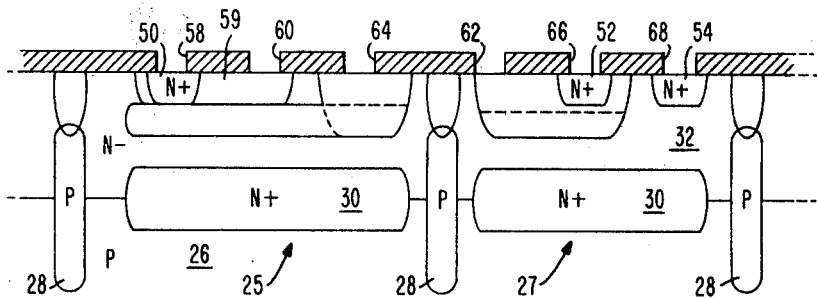

FIG. 2E illustrates the next step of forming a fourth ion-implantation mask out of a hardened photoresist, for example, having all of the holes 58, 60, 62, 64, 66 and 68 formed therein. By selectively blocking the holes 60, 62 and 64, an ion-implantation step can be carried out with arsenic ions, for example, to form the N+ base contact 50 for the vertical PNP device 25, the N+ emitter 52 for the vertical NPN device 27 and the N+ collector contact 54 for the NPN device 27. The ion-implantation blocks in windows 60, 62 and 64 can be removed and a layer of metal such as aluminum can be deposited through these windows forming the base electrode 70 for the vertical PNP device 25, the Schottky emitter 72 for the vertical PNP device 25 and the collector electrode 74 for the PNP device 25. The metal layer further forms the electrical contact 76 for the base 44, the emitter contact 78 for the emitter 52, and the collector contact 80 for the epitaxial layer 32 for the vertical NPN device 27. The finished vertical PNP structure with Schottky Barrier Diode emitter is shown in FIG. 2F.

FIG. 2G illustrates the relative concentration of the dopants along with section line 2G—2G' of FIG. 2F.

The emitter of the PNP structure 25 is formed by a Schottky Barrier Diode contact 72 to the N-type base region 59 using a diffusion barrier metal scheme. The Schottky contact metal system should not deplete the silicon from the base region 59 of the PNP structure 25 or cause irregular penetration of the contact metal system into the silicon substrate. The essential requirements for this emitter contact 72 to be effective as an efficient hole injector into the N-type base region 59 are the following:

The contact metal system should be chosen from a group of metals and/or metal alloys so that a minimum amount of reaction exists between the metal system and the silicon at or below the desired contact sinter temperature.

Figure 3:
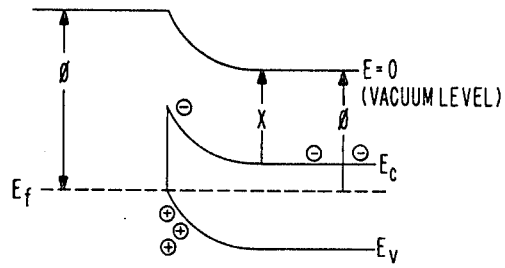
FIG. 3 is an energy band diagram illustrating the physical principle of hole injection by a Schottky Barrier emitter.

The work function of the contact metal system must be greater than that of the N-type base region to insure the proper energy band bending near the metal/silicon interface (see FIG. 3).

The work function of the contact metal system must be large enough to insure a sufficient hole concentration (i.e., an inversion layer) near the metal/silicon interface. From the above cited Scharfetter reference, it can be estimated that a metal work function of approximately 4.8 e.v. or greater would insure a large enough SBD barrier height to satisfy this condition.

The Schottky Barrier contact may be composed of aluminum saturated with 1.5% silicon. Alternately, the Schottky Barrier contact may be formed from a metal alloy of 90% titanium and 10% tungsten. Alternately, the Schottky Barrier contact may be formed from tantalum metal.

The contact metal system should completely cover the exposed contact area with a slight overlapping of the passivation dielectric structure protecting the structure as shown in FIG. 2F. This will insure that no exposed contact edge effects can produce anomalous changes in the electrical characteristics of the device after initial processing.

The Schottky Barrier contact metal is deposited, for example, by vacuum evaporating an aluminum silicon alloy followed by annealing the alloy at approximately 450° C. for approximately one hour.

Although a Schottky Barrier Diode is a majority carrier injection device, it can inject minority carriers under certain conditions. Such minority carrier injection is normally undesirable; however it can be made useful if one wants to employ the device as an emitter of a PNP transistor structure 25. To satisfy the desired PNP configuration, the metal alloy to be used as the Schottky Barrier Diode contact must have a work function greater than that of the silicon substrate to insure the proper energy band bending near the metal/silicon interface. This can be shown in FIG. 3 which is a one-dimensional energy band diagram of the interface between the metal and N-type silicon. In the normal operation of this type structure, the barrier height of the metal, $\phi$ metal, must be very much greater than the barrier height of the silicon, $\phi$ silicon, to insure an adequate hole concentration in the surface inversion layers of the Schottky Barrier Diode emitter. The base of the device is generally an N-type epitaxial layer such as layer 32 while the collector 34 can be either a deep P-type implant or a buried diffusion such as the bottom isolation layer. If a collector 34 is to be isolated from the substrate, a deep implant would be the most effective type of collector. A P epitaxial layer can also be used for this purpose but may be rather complex to introduce into a standard bipolar fabrication process.

Figure 5:
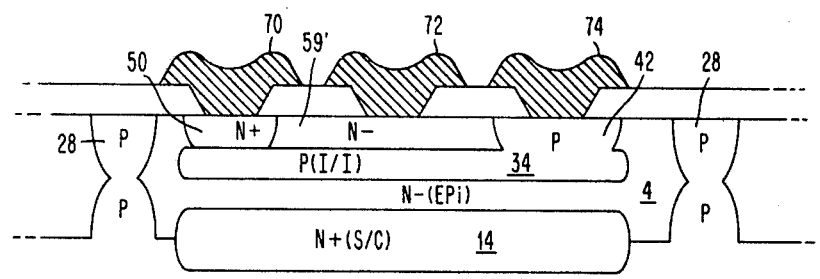
FIG. 5 is an alternate embodiment of the vertical PNP structure with Schottky Barrier Diode emitter, wherein the ion-implanted base region 59 is replaced by the epitaxial layer 4.
Figure 6:
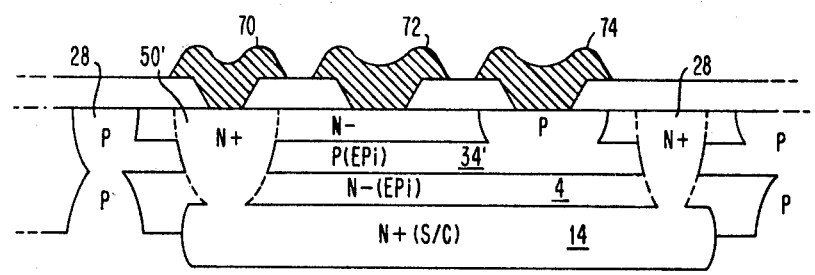
FIG. 6 is still another alternate embodiment of the invention employing a P epitaxial layer as the collector region.

Illustrations of two possible alternate versions of a vertical PNP device to the device 25 shown in FIG. 2F, which employ the Schottky Barrier Diode contact as an emitter are shown in FIGS. 5 and 6. In FIG. 5, the base region 59' is the N-type epitaxial layer 4 itself, instead of an ion-implanted N-type region as was shown in FIG. 2F. All of the other elements shown in FIG. 5 are the same as those for the vertical PNP device 25 of FIG. 2F. FIG. 6 illustrates another alternate embodiment where the P-type base region 34' is formed from a P-type epitaxial layer which lies over the N-type epitaxial layer 4.

Figure 7B:
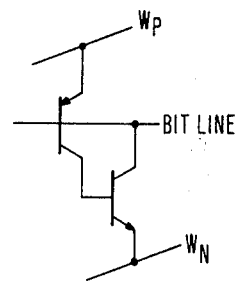
FIG. 7B is an electrical schematic of one dynamic RAM cell in the structure shown in FIG. 7A.
Figure 7A:
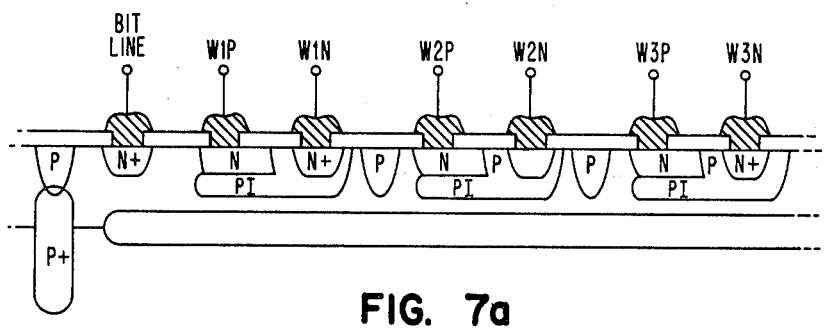
FIG. 7A is a cross-sectional view of a bipolar dynamic RAM cell incorporating the disclosed vertical PNP structure with Schottky Barrier Diode emitter.
Figure 4:
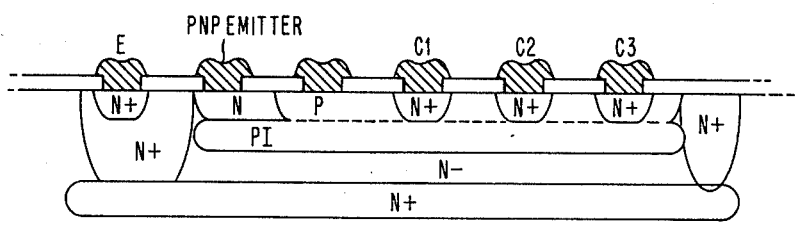
FIG. 4 is a cross-sectional view of an integrated injection logic gate using the disclosed vertical PNP structure with Schottky Barrier diode emitter.

FIG. 7A illustrates a bipolar dynamic RAM cell incorporating the disclosed vertical PNP device with a Schottky Barrier Diode emitter and FIG. 7B illustrates the corresponding circuit schematic for the devices in FIG. 7A. FIG. 4 shows an integrated injection logic version of a structure shown in FIG. 7A using the disclosed vertical PNP device with Schottky Barrier Diode emitter.

A description of the theory of the transistor gain for the vertical PNP device with Schottky Barrier Diode emitter follows.

By way of background, the basic bipolar transistor gain equation is:

$$a = g_o \cdot B^* \cdot a^*$$

where
 a = grounded base current gain
 $g_o$ = emitter carrier injection efficiency
 $B^*$ = base transport factor
 $a^*$ = collector multiplication factor.
Reference: A. B. Phillips, "Transistor Engineering," McGraw-Hill Book Co. (N.Y., 1962), Chap. 8.

The theoretical basis for the operation of the present structure can be better understood by examining the expression for the hole injection efficiency of a Schottky Barrier Diode emitter junction, which is given by:

$$g_o = e \cdot D_p n_i^2 / N_D \cdot L \cdot J_s.$$

Since $a \propto g_o$, by increasing $g_o$ to near unity the device current gain will also approach unity (for $B^*$, $a^* \approx 1$).

The key optimization parameters for the Schottky Barrier Diode PNP structure disclosed herein are $D_p$, $N_D$, L and $J_s$. The first parameter $D_p$, is the hole diffusivity in the base region and is directly proportional to hole mobility. Hence hole mobility should be maximized in the base region. This can occur by decreasing both the doping concentration and the defect concentration in that region to minimize hole scattering centers.

The latter three parameters ($N_D$, L and $J_s$) should all be minimized for optimum $g_o$:
 (1) $N_D$ is the base impurity concentration, which also affects $D_p$.
 (2) L is the base width, which should be reduced to insure a high injected carrier transport collection efficiency.
 (3) $J_s$ is the Schottky Barrier Diode electron current density coefficient, which should be minimized to insure a dominance of hole injection at the metal/semiconductor emitter boundary interface. $J_s$ will decrease as $\phi_B$ is increased, hence a high work function barrier metal is essential at the emitter/silicon interface to insure enough band bending to support a high hole concentration.

While the invention has been particularly shown and described with reference to the preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for fabricating an array of complementary bipolar transistors in an N-type silicon substrate, comprising the steps of:

ion implanting a first plurality of P-type regions relatively deeply beneath the surface of said substrate, a first subplurality thereof forming the subcollectors of PNP transistors and a second subplurality thereof forming the intrinsic base region of NPN transistors;

ion implanting a second plurality of P-type regions shallowly beneath the surface of said substrate, each of a first subplurality thereof juxtaposed above and intersecting respective ones of said first subplurality in said first plurality of P-type regions, forming the collector contacts for said PNP transistors and each of a second subplurality thereof juxtaposed above and intersecting respective ones of said second subplurality of said first plurality of P-type regions, forming the extrinsic base region of said NPN transistors;

ion implanting a plurality of N-type conductivity base regions in said substrate, each juxtaposed above and intersecting a respective one of said first subplurality of PNP subcollectors, forming the base regions of PNP transistors, said N-type base regions having a dopant concentration at the surface of said substrate of less than $10^{17}$ atoms per cubic centimeter;

depositing a plurality of metal contacts having a metal work function of approximately 4.8 electron volts or greater, on the surface of said substrate, each spaced from a respective one of said first subplurality of PNP collector contacts and electrically contacting a respective, corresponding one of said plurality of N-type conductivity base regions, forming a Schottky Barrier emitter for each of said PNP transistors, having a barrier height with a magnitude greater than 0.8 electron volts;

ion implanting an N-type dopant as the base contact in said PNP transistors and as the emitter in said NPN transistors;

whereby a plurality of PNP bipolar transistors with Schottky Barrier contact emitters is formed simultaneously with a plurality of NPN transistors on the same semiconductor chip.

2. The method of claim 1, wherein said step of forming N-type conductivity base regions is carried out by ion-implanting phosphorous ions at an acceleration voltage of approximately 200 KeV and a dose of approximately $2 \times 10^{12}$ atoms per square centimeter.

3. The method of claim 1, wherein said step of forming Schottky Barrier contacts is carried out by vacuum evaporating an aluminum silicon alloy followed by annealing the alloy at approximately 450° C. for approximately one hour.

* * * * *